(12) United States Patent
Wu et al.

(10) Patent No.: US 11,579,191 B2
(45) Date of Patent: Feb. 14, 2023

(54) METHOD AND SYSTEM FOR TESTING AN INTEGRATED CIRCUIT

(71) Applicant: TAIWAN SEMICONDUCTOR MANUFACTURING CO., LTD., Hsinchu (TW)

(72) Inventors: Chi-Che Wu, Hsinchu (TW); Tsung-Yang Hung, Hsinchu County (TW); Ming-Yih Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 191 days.

(21) Appl. No.: 17/023,226

(22) Filed: Sep. 16, 2020

(65) Prior Publication Data

US 2021/0396804 A1 Dec. 23, 2021

Related U.S. Application Data

(60) Provisional application No. 63/041,236, filed on Jun. 19, 2020.

(51) Int. Cl.
*G01R 31/28* (2006.01)

(52) U.S. Cl.
CPC ..... *G01R 31/2896* (2013.01); *G01R 31/2834* (2013.01)

(58) Field of Classification Search
CPC ............ G01R 31/2896; G01R 31/2834; G01R 31/2844; G01R 31/318569; G01R 31/318536; G01R 31/318541; G01R 31/318547; G01R 31/318555; G01R 31/318583
See application file for complete search history.

(56) References Cited

U.S. PATENT DOCUMENTS

| | | | |
|---|---|---|---|
| 9,945,904 B1 * | 4/2018 | Song | G01R 31/318566 |
| 10,088,520 B1 * | 10/2018 | Song | G01R 31/2889 |
| 10,228,419 B2 * | 3/2019 | Song | G01R 31/318536 |
| 10,921,371 B2 * | 2/2021 | Shah | G01R 31/3177 |
| 11,288,428 B1 * | 3/2022 | Gizdarski | G06F 30/333 |
| 2009/0113263 A1 * | 4/2009 | Cannon | G01R 31/318536 714/E11.155 |
| 2012/0129301 A1 * | 5/2012 | Or-Bach | H01L 27/1203 438/129 |
| 2012/0173940 A1 * | 7/2012 | Wang | G06F 30/327 714/E11.155 |
| 2014/0298123 A1 * | 10/2014 | Tekumalla | G06F 11/2017 714/726 |
| 2015/0113344 A1 * | 4/2015 | Morton | G01R 31/318558 714/727 |
| 2018/0045781 A1 * | 2/2018 | Song | G01R 31/2815 |
| 2018/0106859 A1 * | 4/2018 | Song | G01R 31/318536 |

(Continued)

*Primary Examiner* — Manuel A Rivera Vargas
*Assistant Examiner* — Yaritza H Perez Bermudez
(74) *Attorney, Agent, or Firm* — Maschoff Brennan

(57) ABSTRACT

A method is provided in the present disclosure. The method includes several operations: generating, by a processing unit, a mapping table associated with multiple scan chains and multiple shift cycles corresponding to multiple values stored in the scan chains in an integrated circuit; determining, based on the mapping table, at least one fail flip flop in the scan chains in response to the values outputted from the scan chains; and identifying at least one fault site corresponding to the at least one fail flip flop.

20 Claims, 8 Drawing Sheets

(56) References Cited

U.S. PATENT DOCUMENTS

2018/0232302 A1\* 8/2018 Tsutsui ................ H02J 13/0003
2021/0033669 A1\* 2/2021 Cheng ................ G01R 31/3177
2021/0156914 A1\* 5/2021 Ning .............. G01R 31/318558

\* cited by examiner

400

| | (shift cycle) | | | |
|---|---|---|---|---|
| | 4 | 3 | 2 | 1 |
| PIN1 | 1 | 1 | 0 | 0 |
| PIN2 | 1 | F | 0 | 0 |
| PIN3 | 1 | 1 | 0 | 0 |

1000

(shift cycle)

| | 6 | 5 | 4 | 3 | 2 | 1 |
|---|---|---|---|---|---|---|
| PIN1 | 1 | 0 | F | 0 | F | 0 |
| PIN2 | | | | 1 | 0 | F |
| PIN3 | | | 1 | 1 | 0 | 0 |

METHOD AND SYSTEM FOR TESTING AN INTEGRATED CIRCUIT

CROSS-REFERENCE TO RELATED APPLICATION

The present application claims priority to U.S. Provisional Patent Application No. 63/041,236, filed on Jun. 19, 2020, which is incorporated by reference herein in its entirety.

BACKGROUND

In semiconductor integrated circuit manufacturing, integrated circuits (ICs) are conventionally tested during manufacturing and prior to shipment to ensure proper operation. Wafer testing is a testing technique commonly used in production testing of wafer-mounted semiconductor ICs where a temporary electrical connection is established between an automatic test equipment (ATE) and ICs formed on the wafer to demonstrate proper performance of the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
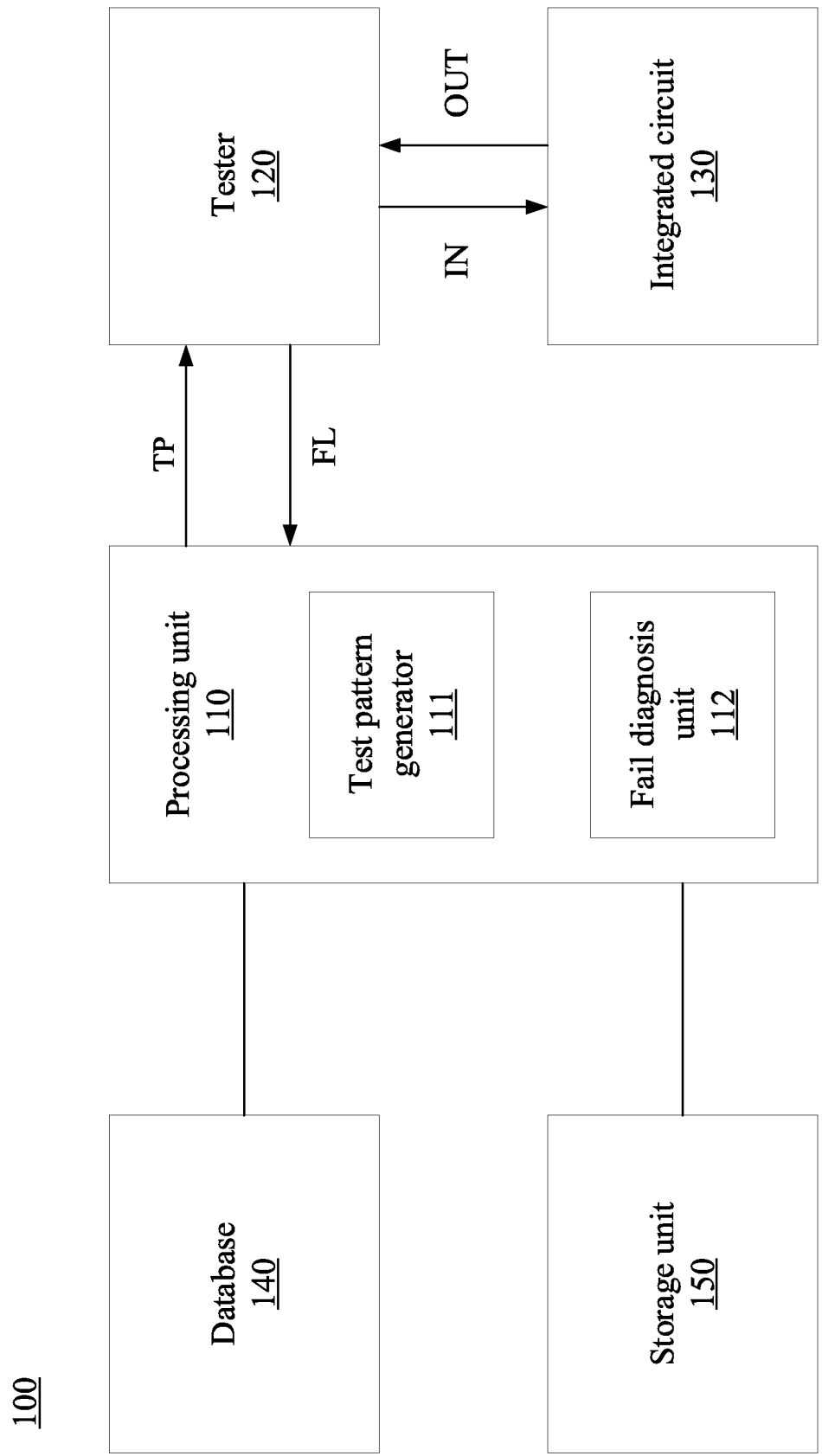
FIG. 1 is a block diagram of a test system for testing an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Integrated circuits including system-on-chips (SoCs) integrate various digital and sometimes analog components on a single chip. Integrated circuits may have manufacturing defects such as physical failures and fabrication defects that cause the integrated circuits to malfunction. Thus, the integrated circuits need to be tested to detect manufacturing defects. Design for test (DFT) techniques add testability features to integrated circuits that allow automatic test equipment (ATEs) to execute various fault tests using test patterns. Integrated circuits that undergo fault testing include multiple scan flip-flops that form a scan-chain. Test data is shifted in one end of the scan chain and out the other with the starting data compared to the shift out data to detect any faults.

Scan chain diagnosis focuses on stuck at fault detection, in which the term "stuck at fault" implies that a logic state(s) of one or more flip flop is not able to be rewritten or changed. Scan chain diagnosis can diagnose and identify one fail scan flip flop in a scan chain under normal operation power condition, for example, the scan chain operating with a first voltage. However, when the fail flip flop having a tiny leakage at relatively lower voltage, the current scan chain diagnosis operating with the higher first voltage is not capable to detect the fail flip flop.

The present disclosure provides a method for diagnosing the fail flip flop having a tiny leakage at relatively lower voltage compared with normal operation and identifying a fault site corresponding to the fail flip flop for further physical failure analysis (PFA). Accordingly, root causes of the failure are investigated for continue improve process (CIP) to achieve higher yield and reliability of the integrated circuits.

Reference is now made to FIG. 1. FIG. 1 is a block diagram of a test system 100 for testing an integrated circuit 130, in accordance with some embodiments of the present disclosure. As illustratively shown in FIG. 1, the test system 100 includes a processing unit 110, a tester 120, an integrated circuit 130 for being tested, a database 140, and a storage unit 150. The processing unit 110 is coupled to the tester 120, the database 140, and the storage unit 150. In operation, in some embodiments, the processing unit 110 outputs a test pattern signal TP to the tester 120. The tester 120 transfers a input signal IN to the integrated circuit 130 for testing and receives an output signal OUT including test resultant values. The tester 120 further generates a fail log based on the output signal OUT and sends the fail log to the processing unit 110.

In some embodiments, the processing unit 110 is included in a host computer programmed by a testing engineer. The processing unit 110 is coupled to the tester 120 via a bus (not shown). The processing unit 110 is configured to execute computer program codes encoded in the storage unit 150 and receive data from the database 140 in order to cause the test system 100 to be usable for performing a portion or all of the following noted processes and/or methods. In one or more embodiments, the processing unit 110 is a central processing unit (CPU), a multi-processor, a distributed processing system, an application specific integrated circuit (ASIC), and/or a suitable processing unit.

As shown in FIG. 1, in some embodiments, the processing unit 110 further includes a test pattern generator and a fail diagnosis unit 112. The test pattern generator 111 is configured to receive a scan chain test pattern from the database 140 and generates the test pattern signal TP for the testing. The fail diagnosis unit 112 is configured to analyze, based on a mapping table stored in the storage unit 150, the fail log FL received from the tester 120. The fail diagnosis unit 112 is further configured to receive sites (corresponding to an integrated circuit layout) of tested flip flops in the integrated circuit 130 and identify the fault site corresponding to the fail flip flop according to the analyzing.

In some embodiments, the processes performed by the processing unit 110 are realized as functions of a program stored in the storage unit 150 with data stored in the database 140. In some embodiments, the database 140 and the storage unit 150 are electronic, magnetic, optical, electromagnetic, infrared, and/or a semiconductor system (or apparatus or device). For example, each of the database 140 and the storage unit 150 includes semiconductor or solid-state memory, a magnetic tape, a removable computer diskette, a random access memory (RAM), a read-only memory (ROM), a rigid magnetic disk, and/or an optical disk. In one or more embodiments using optical disks, each of the database 140 and the storage unit 150 includes a compact disk-read only memory (CD-ROM), a compact disk-read/write (CD-R/W), and/or a digital video disc (DVD). In some embodiments, each of the database 140 and the storage unit 150 includes a non-transitory computer readable recording medium. Examples of a non-transitory computer readable recording medium include, but are not limited to, external/removable and/or internal/built-in storage or memory unit as mentioned above.

With continued reference to FIG. 1, the tester 120 is implemented with the automatic test equipment (ATE). The suitable ATE is based on a chip or chip package testing system, typically comprising a master controller (usually a computer) that synchronizes one or more source and capture instruments such as D/A and A/D converters. The integrated circuit 130 is a device under test (DUT) typically connected physically to the ATE by a robotic handler or prober that engages conductors on the chip and adapts the ATE's output and input resources to operationally unite the ATE with the integrated circuit 130, temporarily during testing. The engaged conductors include input and output lines to the integrated circuit 130 but also include conductors that are accessible on the surface of the integrated circuit 130 to contact with ATE probes. The ATE probes are part of a customized interface test adapter (ITA) or "fixture," typically customized for the integrated circuit design and able to adapt the ATE's resources to the DUT. The ATE applies static levels or dynamically changing digital or analog levels, in a sequence or pattern designed to establish operational scenarios that operate the integrated circuit 130.

The configurations of FIG. 1 are given for illustrative purposes. Various implements are within the contemplated scope of the present disclosure. For example, in some embodiments, the database 140 and storage unit 150 are integrated together.

Figure 2:
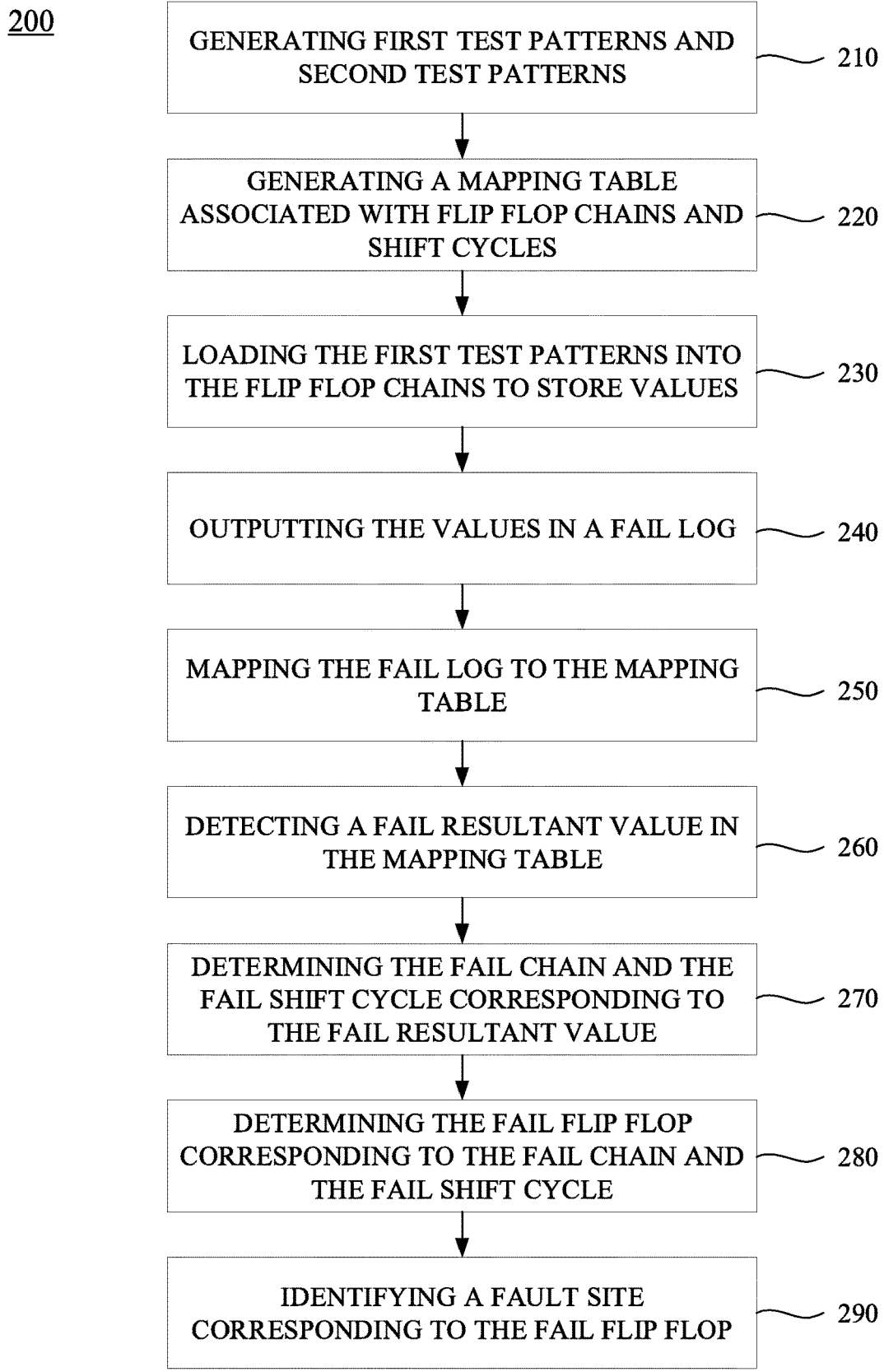
FIG. 2 is a flow chart of a method of testing the integrated circuit, in accordance with some embodiments of the present disclosure.

Reference is now made to FIG. 2. FIG. 2 is a flow chart of a method 200 of testing the integrated circuit 130, in accordance with some embodiments of the present disclosure. It is understood that additional operations can be provided before, during, and after the processes shown by FIG. 2, and some of the operations described below can be replaced or eliminated, for additional embodiments of the method. The order of the operations/processes may be interchangeable. Throughout the various views and illustrative embodiments, like reference numbers are used to designate like elements. The method 200 includes operations 210-290 that are described below with reference to the testing system 100 of FIG. 1.

In operation 210, the test pattern generator 111 of the processing unit 110 generates, based on scan chain test patterns, multiple first test patterns and second test patterns that are included in the test pattern signal TP. For example, in some embodiments, the scan chain test patterns include test data and commands of the operation of the tester 120 (i.e., downloading test data, sequences, conditions or timing selections) to test the integrated circuit 130. Each scan chain test pattern is programmed for a certain one scan (flip flop) chain. The first test patterns are associated with shifting in test data into the scan chains and storing values of the test data in the flip flops 313 of each scan chain. The second test patterns are associated with shifting out stored values from the scan chains and detecting fail flip flops.

In operation 220, the processing unit 110 is configured to generate a mapping table associated with the scan chains and shift cycles. For example, in some embodiments, there are three scan chains in a scan flip flop circuit and four shift cycles are required to clock(shift) out all stored values (i.e., four values(bits)) in the scan chains. Accordingly, the mapping table includes three rows corresponding to the three scan chains and four columns corresponding to the four shift cycles. In various embodiments, the generated mapping table is stored in the storage unit 150.

In some embodiments, the operation of generating the mapping table further includes an operation of acquiring the first test patterns to determine the shift cycles and the scan chains. For example, the first test patterns include the test data including four values for each of the three scan chains. Accordingly, the mapping table is generated alike the one mentioned above. In some embodiments, the second test patterns include the same information about the number of scan chains and the number of values in test data. Thus, alternatively stated, the operation of generating the mapping table further includes an operation of acquiring the second test patterns to determine the shift cycles and the scan chains.

Figure 3:
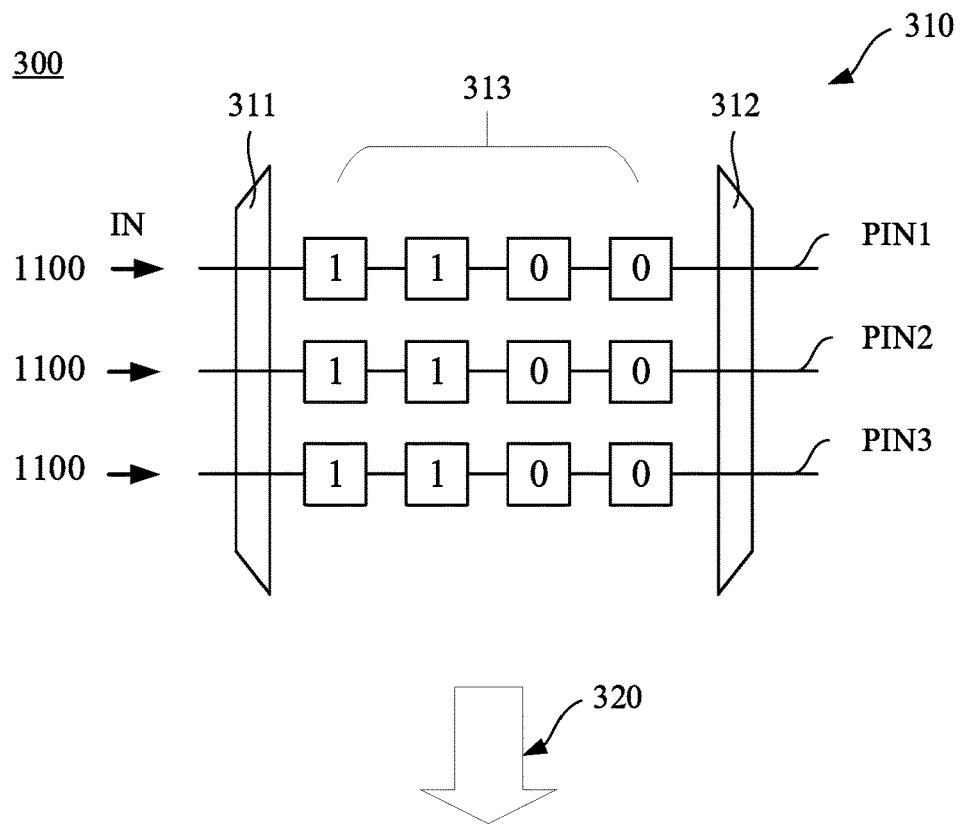
FIG. 3 illustrates schematic diagrams of an operating simplified scan flip flop circuit included in the integrated circuit of FIG. 1, in accordance with some embodiments of the present disclosure.
Figure 3:
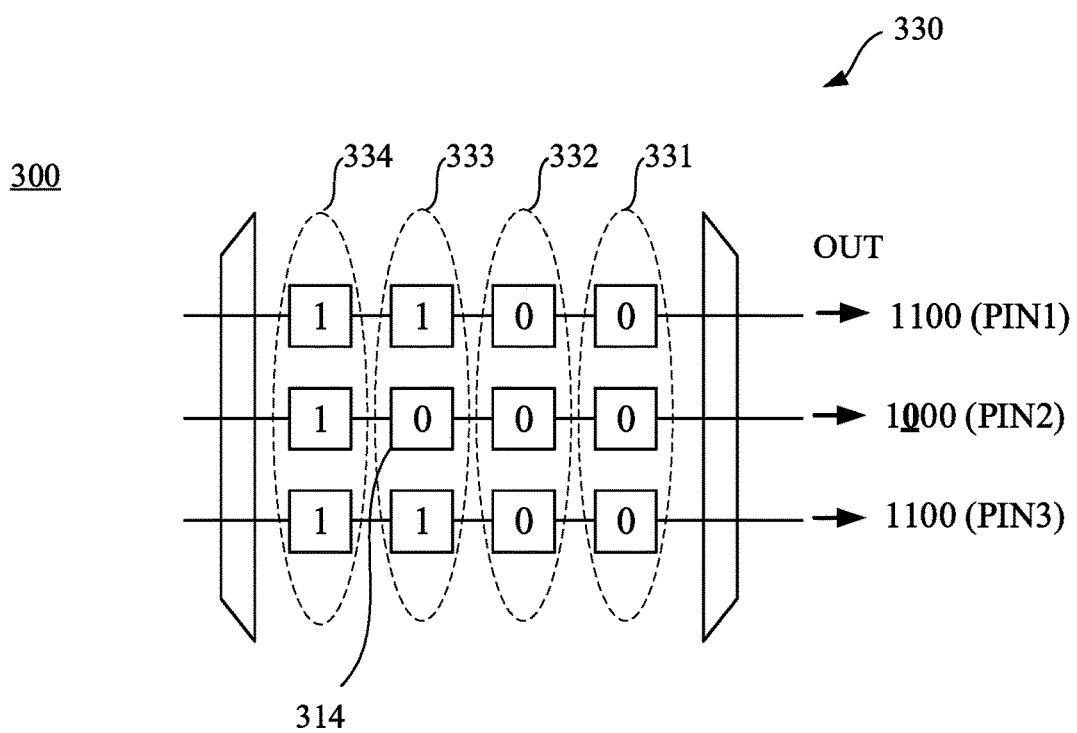

In operation 230, the tester 120 tests a scan flip flop circuit by loading the first test patterns into the scan chains to store values associated with the first test patterns, as shown in FIG. 3. FIG. 3 illustrates schematic diagrams of the operating simplified scan flip flop circuit 300 included in the integrated circuit 130 of FIG. 1, in accordance with some embodiments of the present disclosure. For illustration, the scan flip flop circuit 300 includes a decompressor 311, a compressor 312, and flip flops 313 included in three scan chains. The number of the scan chains and the flip flops 313 in FIG. 3 are given for illustrative purposes. Various implements of numbers of the scan chains and the flip flops 313 are within the contemplated scope of the present disclosure. The scan flip flop circuit 300 operates in three stage 310-330. As shown in FIG. 3, the decompressor 311 receives the first test patterns loaded as the input signal IN and decompresses test data into the scan chains. Test data having a "1100" sequence is clocked in the each of the scan chain and stored in corresponding flip flops. In some embodiments, the scan chains are operating at a first voltage level at the stage 310. In various embodiments, the stage 310 is referred to as a normal operation mode.

In some embodiments, the method 200 further includes an operation of reducing the operation voltage level of the scan flip flop circuit 300. As shown in FIG. 3, at the stage 320, the scan flip flop circuit 300 is operating at a second voltage level lower than the first voltage level of the stage 310. A ratio between the second voltage level to the first voltage level is in a range of about 80% to about 20%. In various embodiments, the operation voltage level of the scan flip flop circuit 300 remains at the second voltage level for a certain duration. The duration is determined by experimental results that indicate sufficient durations for detecting a tiny leakage in fail flip flops, and the duration is IC design and/or technology dependent. In various embodiments, the duration is greater than about 100 ms.

In operation 240, the tester 120 re-tests the scan flip flop circuit 300 by the second test pattern to output the values stored in the flip flops 313 and to record the values (i.e., to be referred to as resultant patterns) in the fail log FL. In some embodiments, the outputted values are recorded into the second test patterns. For illustration, as shown in FIG. 3, at the stage 330, the operation voltage of the scan flip flop circuit 300 changes to the first voltage and the scan flip flop circuit 300 operates in the normal operation mode. The scan flip flop circuit 300 outputs the values in a predetermined number of shift cycles and the outputted values are recorded in the fail log FL through the output signal OUT. The output signal OUT is generated by the compressor 312 compressing values at pins PIN1-PIN3. For example, because four values are stored in the scan chains, at least four shift cycles are executed. Moreover, values circled by loops 331-334 of FIG. 3 are outputted in the same shift cycles. For example, the first value "0" at a pin PIN1 corresponding to the top scan chain, the first value "0" at a pin PIN2 corresponding to the middle scan chain, and the first value "0" at a pin PIN3 corresponding to the bottom scan chain are outputted together in shift cycle 1 (loop 331), and so on. In some embodiments, as shown in FIG. 3, when a flip flop turns failed (marked as 314) after the scan flip flop circuit 300 swings between the first voltage level and the second voltage level, the stored value changes from desired "1" into "0". Accordingly, the output data at the pin PIN2 has a "1000" sequence, in which the fail value is the first "0" from the left and marked bold and underlining in FIG. 3.

In some embodiments, the re-testing further includes an operation of generating a fail resultant value by comparing the inputted values with the outputted values. For example, as mentioned above, the third value outputted in cycle 3 (loop 333) at the pin PIN2 is identified as a fail value by comparing the outputted sequence "1000" with the input sequence "1100". The tester 120 to give indication of the fail third value generates the fail resultant value "F" in the fail log correspondingly. In some embodiments, for example, the fail log FL is represented as below, corresponding to the embodiments shown in FIG. 3:

1100
1F00
1100

The values in the top row correspond to the top scan chain coupled to the pin PIN1. The values in the middle row correspond to the middle scan chain coupled to the pin PIN2. The values in the bottom row correspond to the bottom scan chain coupled to the pin PIN3. Alternatively stated, the fail log is associated with the scan chains, values, and sequence of the shift cycles. The configurations of fail resultant value are given for illustrative purposes. Various implements are within the contemplated scope of the present disclosure. For example, in some embodiments, the fail resultant value is given as "X".

With continued reference to FIG. 2, the fail diagnosis unit 112 is configured to diagnose the fail flip flop in the scan chain according to the fail log FL and the mapping table. The detail operations including operation 250-290 are described as below.

Figures 4A, 4B:
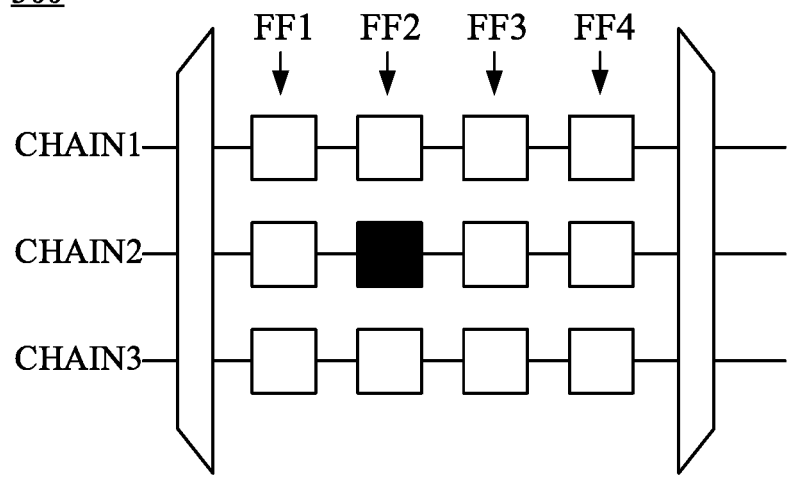
FIG. 4A is a schematic diagram of a mapping table corresponding to the scan flip flop circuit of FIG. 3, in accordance with some embodiments of the present disclosure.
FIG. 4B is a schematic diagram of the scan flip flop circuit of FIG. 3, in accordance with some embodiments of the present disclosure.

In operation 250, the fail diagnosis unit 112 of the processing unit 110 analyzes the fail log FL through mapping the fail log FL to the mapping table as shown in FIG. 4A. FIG. 4A is a schematic diagram of a mapping table 400 corresponding to the scan flip flop circuit 300 of FIG. 3, in accordance with some embodiments of the present disclosure. As illustratively shown in FIG. 4A, for example, the values in the top row of the fail log FL are recorded in the top row of the mapping table, and the first value "0" outputted in shift cycle 1 is stored in the rightmost column corresponding to shift cycle 1. The configurations of the other values being recorded in the mapping table 400 are similar to the values in the top row of the fail log FL. Thus, the repetitious descriptions are omitted. The configurations of the mapping table 400 are given for illustrative purposes. Various implements are within the contemplated scope of the present disclosure. For example, in some embodiments, the sequence of the shift cycles in the mapping table 400 is inverted, and accordingly, the values in the fail log FL are recorded in an inverted sequence into the mapping table 400.

In operation 260, the fail diagnosis unit 112 detects the fail resultant value in the mapping table 400. For example, in the embodiments shown in FIG. 4A, the fail resultant value "F" is detected in the second row and the third column counted from the right.

In operation 270, after the fail resultant value is detected, a corresponding fail chain and a corresponding fail shift cycle are determined. For example, as shown in FIG. 4A, the aforementioned fail resultant value "F" corresponds to the pin PIN2 and the shift cycle 3. Because the pin PIN2 corresponds to the middle scan chain in the scan flip flop circuit 300, the middle scan chain is determined as the fail chain.

In operation 280, a fail flip flop corresponding to the fail chain and the fail shift cycle is determined, as shown in FIG. 4B. FIG. 4B is a schematic diagram of the scan flip flop circuit 300 of FIG. 3, in accordance with some embodiments of the present disclosure. For illustration, the pins PIN1-PIN3 correspond to the scan chains CHAIN1-CHAIN3. Flip flops FF1-FF4 in sequence correspond to the flip flops 313 arranged in sequence from the decompressor 311 to the compressor 312. In some embodiments, the fail diagnosis unit 112 maps the fail chain and the fail shift cycle to the scan chains. For example, as mentioned above in the operation 270, the fail middle chain is mapped onto the scan chain CHAIN2. The shift cycle 3 is mapped onto the flip flop FF2. Accordingly, the flip flop marked back in FIG. 4B is determined as the fail flip flop.

In operation 290, a fault site corresponding to the fail flip flop is identified. For example, the fail diagnosis unit 112 acquires from the database 140 sites corresponding to the scan chains CHAIN1-CHAIN3. The sites are referred to as coordinates of the flip flops in the scan chains CHAIN1-CHAIN3 on a layout diagram of the integrated circuit 130. Accordingly, when the fail flip flop is determined, the fail diagnosis unit 112 identifies the fault site corresponding to the fail flip flop.

In some embodiments, the fault site is obtained for test engineers to perform physical failure analysis to the fail flip flop. For example, in some embodiments, the methods of physical failure analysis include transmission electron microscope (TEM), atomic force microscope (AFM), or any other suitable method. Physical failures including, for example, tiny current leakage between terminals of transistors, are investigated. One example of physical failure is given with reference to FIGS. 5-7.

Figure 5:
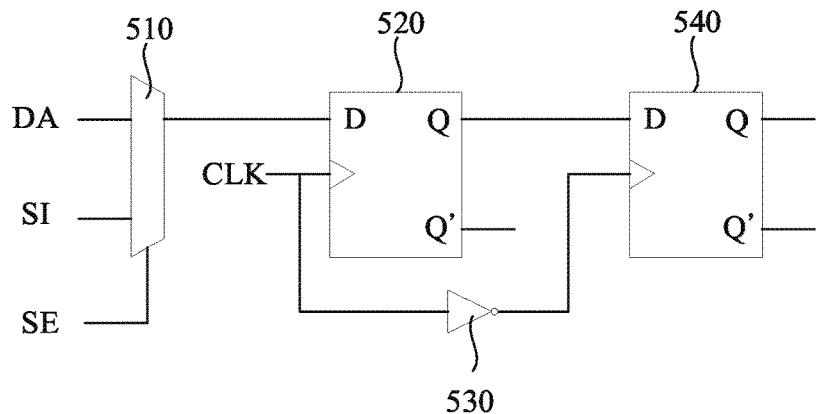
FIG. 5 is a schematic diagram of an operating simplified scan flip flop circuit included in the integrated circuit of FIG. 1, in accordance with some embodiments of the present disclosure.

Reference is now made to FIG. 5. FIG. 5 is a schematic diagram of an one-bit scan flip flop circuit 500 included in the integrated circuit of FIG. 1, in accordance with some embodiments of the present disclosure. For illustration, the scan flip flop circuit 500 includes a multiplexer 510, a first D flip flop 520, an inverter 530, and a second D flip flop 540. Set of signals are inputted into the scan flip flop circuit 500 in order to control and observe the scan mechanism. The multiplexer 510 is configured to receive a scan data input SI, a data input DA and a scan enable signal SE and output the scan data input SI or the data input DA in accordance of the scan enable signal SE. The first and second flip flops 520 and 540 are configured to receive a clock signal CLK and an inverted clock signal to be cross-coupled to store a data state. The inverted clock signal is generated by the inverter 530 inverting the clock signal CLK.

Figure 6:
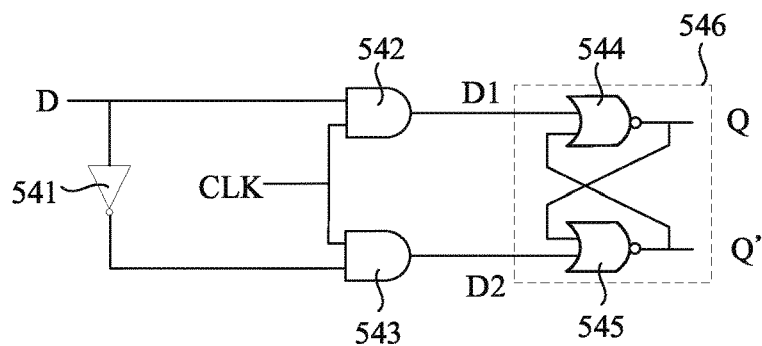
FIG. 6 is a schematic diagram of a flip flop included in the scan flip flop circuit of FIG. 5, in accordance with some embodiments of the present disclosure.

Reference is now made to FIG. 6. FIG. 6 is a schematic diagram of the second D flip flop 540 included in the scan flip flop circuit 500 of FIG. 5, in accordance with some embodiments of the present disclosure. For illustration, the second D flip flop 540 includes an inverter 541, AND gates 542-543, and NOR gates 544-545. The inverter 541 is coupled to the AND gates 542-543 and a terminal D. The AND gates 542-543 are coupled to the clock signal CLK. The NOR gates 544-545 are coupled to output terminals of the AND gates 542-543 to receive data D1-D2. The NOR gates 544-545 are formed in a latch circuit 546 coupled to terminals Q and Q'. In some embodiments, as mentioned above, the test data is shifted in and stored in the scan flip flop circuit 500 operating at the first voltage level. A logic state at the terminal Q represents a logic state stored in the latch circuit 546, for example, "1" or "0".

Figure 7:
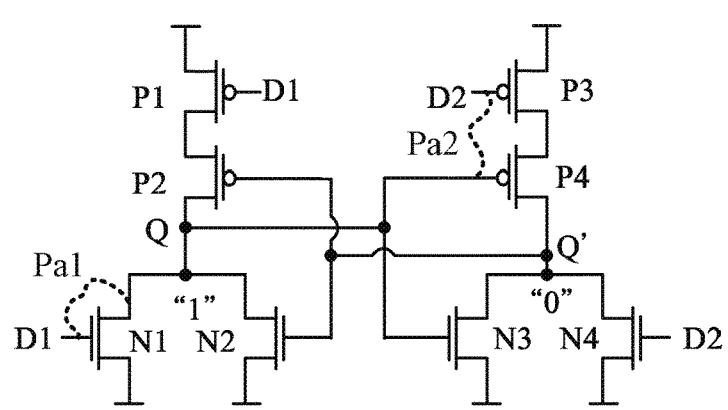
FIG. 7 is a schematic diagram of a latch circuit included in the flip flop circuit of FIG. 6, in accordance with some embodiments of the present disclosure.

Reference is now made to FIG. 7. FIG. 7 is a schematic diagram of the latch circuit 546 included in the flip flop circuit of FIG. 6, in accordance with some embodiments of the present disclosure. For illustration, transistors P1-P2 and N1-N2 are included to form the NOR gate 544. Transistors P3-P4 and N3-N4 are included to form the NOR gate 545. Gates of the transistors P1 and N1, operating as an input terminal of the latch circuit 546, receive the data D1. Gates of the transistors P3 and N4, operating as another input terminal of the latch circuit 546, receive the data D2. Gates of the transistors P2, N2 and drains of the transistors N3-N4 and P4 are coupled at the terminal Q'. Gates of the transistors P4, N3, drains of the transistors N1-N2, and P2 are coupled at the terminal Q.

In some embodiments, with reference to FIG. 6, when the logic state at the terminal D is "1" and the clock signal CLK is "0", the data D1-D2 have logic states "0". Accordingly, as shown in FIG. 7, the logic states at the terminals Q and Q' are "1" and "0" respectively.

In some embodiments, when the latch circuit 546 operates at the second voltage lower than the first voltage level, as mentioned above, the logic states of the terminals Q and Q' get disturbed by the physical failures. For example, in some embodiments, as shown in FIG. 7, charges at the terminal Q having logic "1" flow to the gate of the transistor N1 (having logic 0) through a leakage path Pa1 between the gate of the transistor N1 and the terminal Q. Accordingly, the logic state at the terminal Q turns from "1" to "0". Similarly, in various embodiments, a leakage path Pa2 exists between the gate of the transistor P3 and the terminal Q as shown in FIG. 7. The charges at the terminal Q having logic "1" flow to the gate of the transistor P3 (having logic 0), and the logic state at the terminal Q turns from "1" to "0".

As discussed above, the fail value stored in the latch circuit 546 is shifted out at the first voltage level and is analyzed by the test system 100 of FIG. 1. The flip flop 540 is determined as the fail flip flop. Alternatively stated, by using the test system 100 as mentioned above, the fail flip flop is determined and the coordinate thereof is obtained. Test engineers further utilize physical failure analysis to figure out the root cause of the fail flip flop. For example, a cross-section diagram of the flip flop 540 is obtained through cutting the integrated circuit 130 at the fault site given by the test system 100, and the leakage paths Pa1 and/or Pa2 are found.

The configurations of FIGS. 2-7 are given for illustrative purposes. Various implements are within the contemplated scope of the present disclosure. For example, in some embodiments, instead of recording the exact stored values in the fail log FL, the values, corresponding to the normal flip flops, recorded in the fail log FL are replaced by normal resultant values, for example, "P". Specifically, in the mapping table 400 of FIG. 4A, the values in the top row are "PPPP" and the values in the middle row are "PFPP" correspondingly.

Figure 8:
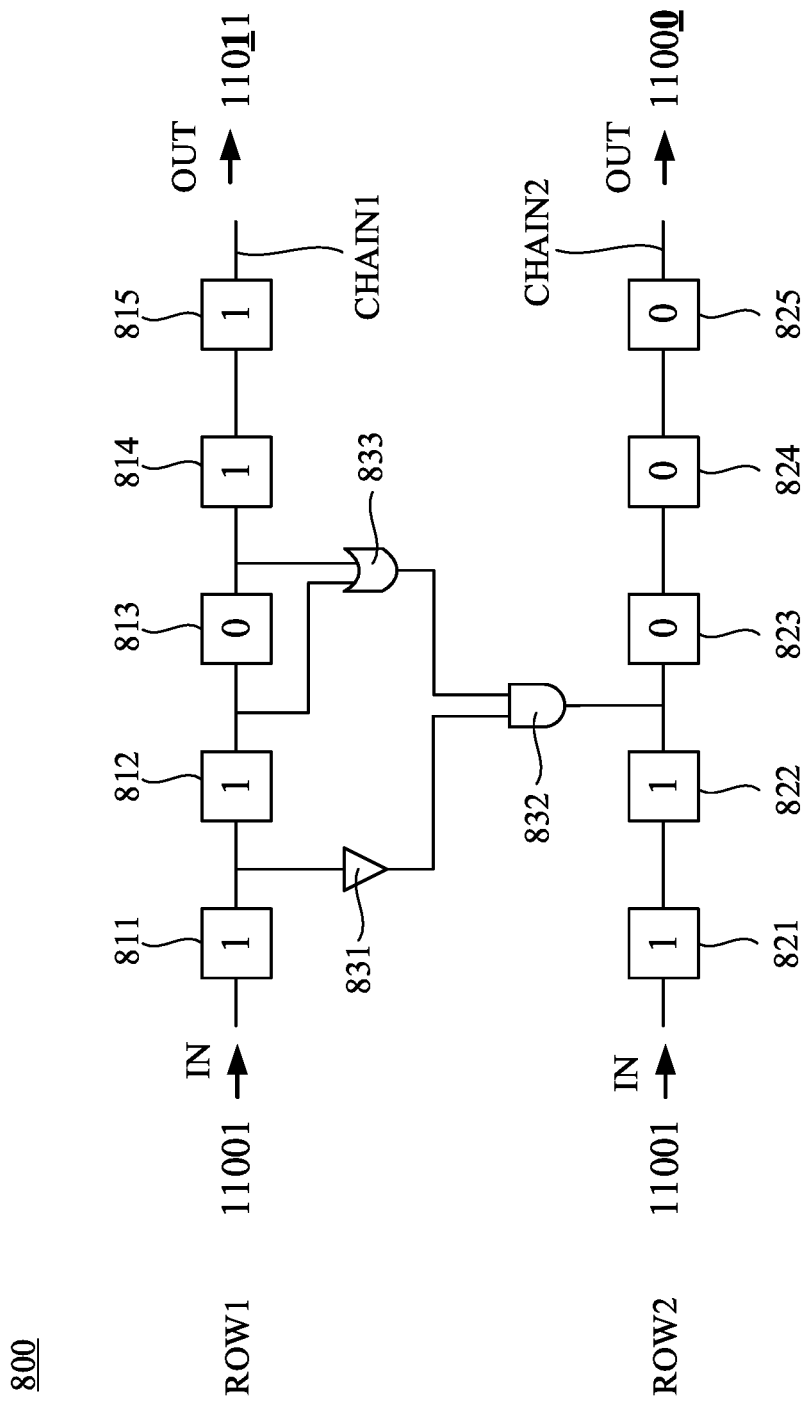
FIG. 8 is a schematic diagram of an operating simplified scan flip flop circuit included in the integrated circuit of FIG. 1, in accordance with some embodiments of the present disclosure.

Reference is now made to FIG. 8. FIG. 8 is a schematic diagram of an operating simplified scan flip flop circuit 800 included in the integrated circuit 130 of FIG. 1, in accordance with some embodiments of the present disclosure. For illustration, scan chains CHAIN1-CHAIN2 are arranged in two adjacent rows ROW1 and ROW2. The scan chain CHAIN1 includes flip flops 811-815, and the scan chain CHAIN2 includes flip flops 821-825. The flip flops 811-812 are coupled to the flip flops 822-823 through an inverter 831 and a AND gate 832. The flip flops 812-814 are coupled to the flip flops 822-823 through a OR gate 833 and the AND gate 832.

In some embodiments, the configurations of testing the scan flip flop circuit 800 are similar to that of testing the scan flip flop circuit 300. Specifically, the scan chains CHAIN1-CHAIN2 are tested by the first test patterns and second test patterns mentions above. Test data including values "11001" are shifted in and stored in the scan chains CHAIN1-CHAIN2 at the first voltage level. After shifting in, the operation voltage level drops to the second voltage level for a duration and then increases to the first voltage level. As illustratively shown in FIG. 8, the stored values "11011", with a fail value being the second "1" from the right, in the scan chain CHAIN1 is shifted out. The stored values "11000", with a fail value being the first "0" from the right, in the scan chain CHAIN2 is shifted out. The fail values are marked bold and underlining in FIG. 8. With the configurations of the test system 100 as illustrated in FIGS. 1-7, based on the outputted values and a corresponding mapping table, the flip flop 814 in the scan chain 1 and the flip flop 825 are determined as fail flip flops.

In some approaches, a scan flip flop circuit is operating at a constant voltage level, for example, the first voltage level as mentioned above. When a flip flop fails and is not able to be flipped (i.e., a logic state is kept "1") in a scan chain, during shifting out operation, every bit passing the fail flip flop is "stuck" and keeps having the logic state of the fail flip flop. For example, as shown in FIG. 8, if the flip flop 814 is the fail flip flop and the logic state thereof is "1", a shifted in test data "11000" is shifted out as "11111" from the scan chain CHAIN1. In such arrangements, because every bit is influenced by the fail flip flop, it is not possible to determine the fail flip flop based upon comparing the shifted out data with the shifted in data. In some approaches, for determining the fail flip flop, the test data is shifted to the scan chain CHAIN2 at the same time through the inverter 831, the AND gate 832, and the OR gate 833. Because the scan chain CHAIN2 has no fail flip flop, the test data is shifted out accurately. By comparing the shifted out data from the scan chains CHAIN1 and CHAIN2 in each shift cycle, the fail flip flop is determined. However, when there is one or more fail flip flops in the scan chain CHAIN2, the shifted out data is influenced by the fail flip flops in the scan chain CHAIN2. It is impossible to identify the fail flip flops in the scan chain CHAIN1 or the scan chain CHAIN2.

Compared with some approaches, as shown in FIG. 8, with the configurations of the present disclosure, the logic state of the fail flip flop is disturbed when the scan flip flop circuit is operating at the second voltage level, and the fail flip flop is still able to be flipped at the first voltage level during shifting out. Accordingly, every bit of the test data is not influenced by the fail flip flop and is shifted out having its original logic state. As descriptions of FIG. 8 above, fail flip flops in each scan chain are identified separately without shifting test data into the adjacent scan chain. Therefore, multiple fail flip flops in two adjacent scan chains are diagnosable. Better flexibility of diagnosing fail flip flops is provided, compared with some approaches.

The configurations of FIG. 8 are given for illustrative purposes. Various implements are within the contemplated scope of the present disclosure. For example, in some embodiments, the inverters 831, the AND gate 832, and the OR gate 833 are eliminated.

Figure 9:
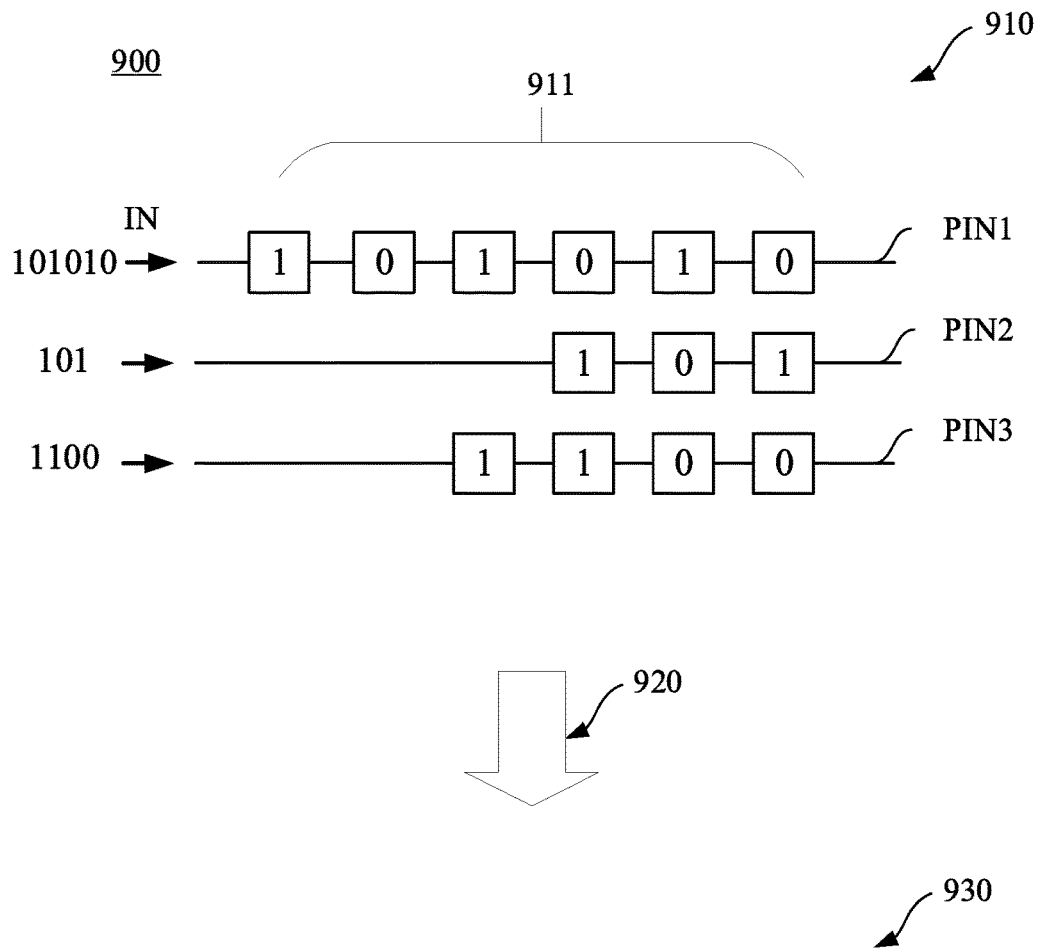
FIG. 9 illustrates schematic diagrams of an operating simplified scan flip flop circuit included in the integrated circuit of FIG. 1, in accordance with some embodiments of the present disclosure.
Figure 9:
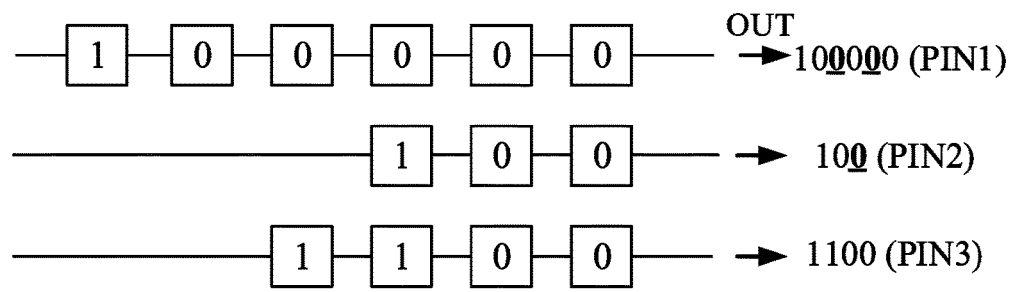

Reference is now made to FIG. 9. FIG. 9 illustrates schematic diagrams of an operating simplified scan flip flop circuit 900 included in the integrated circuit of FIG. 1, in accordance with some embodiments of the present disclosure. In some embodiments, the scan flip flop circuit 900 is configured with respect to, for example, the scan flip flop circuit 300 of FIG. 3. The test system 100 of FIG. 1 further performs the method 200 to test the scan flip flop circuit 900. Operation stages 910-930 are configured with respect to, for example, the stages 310-330 of FIG. 3. Input signal IN is configured with respect to, for example, the input signal IN of FIG. 3. For illustration, the scan flip flop circuit 900 includes flip flops 911. In some embodiments, the flip flops 911 are configured with respect to, for example, the flip flops 313 of FIG. 3. For the sake of brevity, elements including, for example, a corresponding decompressor and compressor, are omitted here.

In some embodiments, there are different numbers of flip flops included in three scan chains. As shown in FIG. 9, six flip flops 911, 3 flip flops 911, and 4 flip flops 911 are included separately in top, middle, and bottom scan chains. In various embodiments, test data (i.e., patterns) for different scan chains are different from each other. For example, as shown in FIG. 9, test data "101010", test data "101", and test data "1100" are shifted into and stored in three different scan chains through the input signals IN at the stage 910. The scan flip flop circuit 900 operates at the first voltage level.

After operating at the stage 920 with the second voltage level lower than the first voltage level for a duration, the scan flip flop circuit 900 operates at the first voltage level at the stage 930. The stored values are shifted out at pins PIN1-PIN3. For illustration, the values "100000" are shifted out at the pin PIN1, the values "100" are shifted out at the pin PIN2, and the values "1100" are shifted out at the pin PIN3.

For the output of the pin PIN1, the fail values are the second "0" and the fourth "0" from the right. For the output of the pin PIN2, the fail value is the first "0" from the right. The fail values are marked bold and underlining in FIG. 9. The shifted out values are recorded in a fail log FL. In some embodiments, for example, the fail log FL is represented as below, corresponding to the embodiments shown in FIG. 9:

10F0F0
10F
1100

The values in the top row correspond to the top scan chain coupled to the pin PIN1. The values in the middle row correspond to the middle scan chain coupled to the pin PIN2. The values in the bottom row correspond to the bottom scan chain coupled to the pin PIN3.

Figures 10A, 10B:
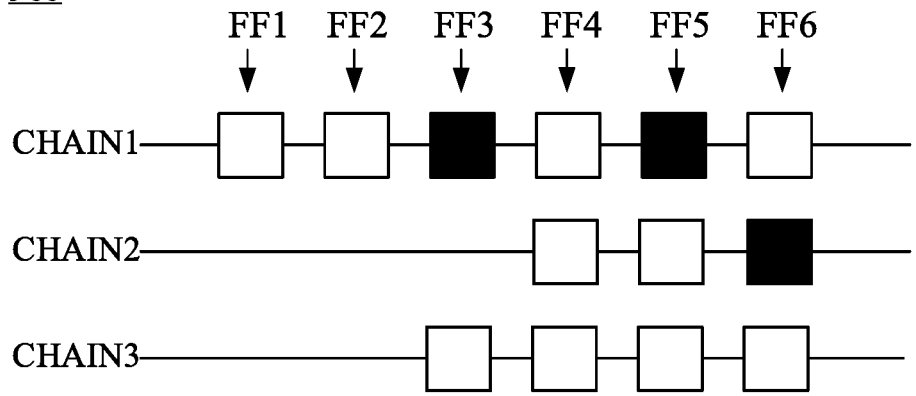
FIG. 10A is a schematic diagram of a mapping table corresponding to the scan flip flop circuit of FIG. 9, in accordance with some embodiments of the present disclosure.
FIG. 10B is a schematic diagram of the scan flip flop circuit corresponding to one of FIG. 9, in accordance with some embodiments of the present disclosure.

Reference is now made to FIG. 10A. FIG. 10A is a schematic diagram of a mapping table 1000 corresponding to the scan flip flop circuit 900 of FIG. 9, in accordance with some embodiments of the present disclosure. For illustration, the values in the fail log FL are recorded in the mapping table 1000, as shown in FIG. 10A.

The fail diagnosis unit 112 of FIG. 1 detects the fail resultant values in the mapping table 1000. For example, in the embodiments shown in FIG. 10A, two fail resultant values "F" are detected in the first row and the second, fourth columns counted from the right, and the other one is detected in the second row and the first column counted from the right.

After the fail resultant values are detected, corresponding fail chains and corresponding fail shift cycles are determined. For example, as shown in FIG. 10A, the one fail resultant value corresponds to the pin PIN1 (the top scan chain) and the shift cycle 2, another corresponds to the pin PIN1 and the shift cycle 4, and the other corresponds to the pin PIN2 (the middle scan chain) and the shift cycle 1.

Reference is now made to FIG. 10B. FIG. 10B is a schematic diagram of the scan flip flop circuit 900 corresponding to one of FIG. 9, in accordance with some embodiments of the present disclosure. For illustration, the pins PIN1-PIN3 correspond to the scan chains CHAIN1-CHAIN3. Flip flops FF1-FF6 in sequence correspond to the flip flops 911 arranged in sequence from the input terminals to the pins. In some embodiments, the fail diagnosis unit 112 maps the fail chains and the fail shift cycles to the scan chains. For example, the pin PIN1 and the shift cycle 2 correspond to the flip flop FF5 in the scan chain CHAIN1. The pin PIN1 and the shift cycle 4 correspond to the flip flop FF3 in the scan chain CHAIN1. The pin PIN2 and the shift cycle 1 correspond to the flip flop FF6 in the scan chain CHAIN2.

In some embodiments, after the fail flip flops are determined, corresponding fault sites are obtained for further physical failure analysis.

The configurations of FIG. 9 are given for illustrative purposes. Various implements are within the contemplated scope of the present disclosure. For example, in some embodiments, the scan chains CHAIN2-CHAIN3 include the same number of flip flops as the scan chain CHAIN1.

As described above, a method is provided for testing a scan flip flop circuit. The scan flip flop circuit swings between a high voltage and a low voltage to detect failures inducing leakage. By utilizing a mapping table to analyze a fail log given by a tester, one or more corresponding fail flip flop are determined for further physical failure analysis. Accordingly, integrated circuits can be tested before shipment to ensure proper operation, tiny leakage detectability could be enhanced and a lower product defect parts per million (DPPM) could be detected in the present disclosure.

In some embodiments, a method is provided in the present disclosure. The method includes several operations: generating, by a processing unit, a mapping table associated with multiple scan chains and multiple shift cycles corresponding to multiple values stored in the scan chains in an integrated circuit; determining, based on the mapping table, at least one fail flip flop in the scan chains in response to the values outputted from the scan chains; and identifying at least one fault site corresponding to the at least one fail flip flop. In some embodiments, generating the mapping table includes acquiring multiple first test patterns to determine the shift cycles and the scan chains. In some embodiments, the method includes generating multiple first test patterns and multiple second test patterns according to multiple scan chain test patterns; loading the first test patterns into the scan chains to store the values associated with the first test patterns; and outputting the values to be included in the second test patterns for determining the at least one fail flip flop. In some embodiments, the method includes operating, by a tester, the integrated circuit for a predetermined number of the shift cycles to generate a fail log; and mapping the fail log to the mapping table to determine the at least one fail flip flop. The fail log is associated with the scan chains and the values. In some embodiments, determining the at least one fail flip flop includes determining at least one fail chain and at least one fail shift cycle corresponding to at least one fail value in the values outputted from the scan chains; and mapping the at least one fail chain and the at least one fail shift cycle to the scan chains to identify the at least one fail flip flop. In some embodiments, when the at least one fail flip flop includes first and second fail flip flops in first and second chains, respectively, of the scan chains, determining the at least one fail flip flop includes identifying a first fail value in outputted values from the first chain and identifying a second fail value in outputted values from the second chain; and determining, based on the mapping table, the first and second fail flip flops. The first chain abuts the second chain and at least one flip flop in the first chain is coupled to the second chain. In some embodiments, the method includes acquiring from a database, by the processing unit, multiple sites, including the at least one fault site, corresponding to the scan chains.

Also disclosed is a method that includes following steps: testing, by a tester, a first scan chain operating at a first voltage level with a first test pattern; after operating the first scan chain at a second voltage level lower than the first voltage level, re-testing the first scan chain operating at the first voltage level with a second test pattern to generate a fail log; and diagnosing, by a processing unit, at least one first fail flip flop in the first scan chain according to the fail log and a mapping table. The mapping table is associated with the first scan chain and multiple shift cycles. In some embodiments, testing the first scan chain with the first test pattern includes loading multiple values into the first scan chain and storing the values in the first scan chain. Re-testing the first scan chain includes clocking the stored values out as multiple outputted values in the shift cycles; and generating at least one fail resultant value by comparing the outputted values with the values. In some embodiments, the fail log is associated with a sequence of plurality of shift cycles and multiple outputted values corresponding to the shift cycles. In some embodiments, diagnosing the at least one first fail flip flop includes mapping the fail log to the mapping table; and detecting at least one fail resultant value in the mapping table for determining the at least one first fail flip flop. In some embodiments, diagnosing the at least one first fail flip flop includes mapping the fail log to the mapping table to determine at least one fail cycle in the shift cycles; determining the at least one first fail flip flop, corresponding to the at least one fail cycle, in the first scan chain; and acquiring from a database, by the processing unit, at least one fault site corresponding to the at least one first fail flip flop for performing a physical fault analysis. In some embodiments, the method includes testing a second scan chain operating at the first voltage level with a third test pattern; after operating the second scan chain at the second voltage, re-testing the second scan chain operating at the first voltage level with a fourth test pattern to update the fail log; and diagnosing, at least one second fail flip flop in the second scan chain according to the fail log and the mapping table. The first scan chain includes at least one flip flop coupled between two adjacent flip flops in the second scan chain. In some embodiments, the first test pattern is different from the third test pattern. In some embodiments, diagnosing the at least one second fail flip flop in the second scan chain includes determining whether an input terminal of a latch circuit for storing values in the at least one second fail flip flop is short circuited.

Also disclosed is a system, including one or more processing units; and a memory unit configured to store instructions that when executed by at least one of the one or more processing units perform operations, including record a resultant pattern received from a tester, wherein the resultant pattern includes multiple bit data; detect at least one fail resultant value in the resultant pattern; determine a fail chain and at least one fail shift cycle that correspond to the at least one fail resultant value; and determine at least one fail flip flop associated with the fail chain and the at least one fail shift cycle. In some embodiments, the operations further include acquire at least one fault site corresponding to the at least one fail flip flop from a database. In some embodiments, the operations further include generate a test pattern based on a scan chain pattern to the tester to operate an integrated circuit swinging between a first voltage level and a second voltage level lower than the first voltage level; and generate a mapping table associated with the test pattern, wherein the mapping table is associated with multiple shift cycles. In some embodiments, the operations further include map the resultant pattern to multiple shift cycle and multiple chains to determine the fail chain and the at least one fail shift cycle. In some embodiments, the operations further include map the at least one fail shift cycle to multiple flip flops in the fail chain to determine the at least one fail flip flop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and adjustations herein without departing from the spirit and scope of the present disclosure.

What is claimed is:

1. A method, comprising:
    generating, by a processing unit, a mapping table indicating an output result of a plurality of pins each outputting a plurality of values stored in a corresponding one of a plurality of scan chains of an integrated circuit in a plurality of shift cycles;
    determining, based on the mapping table, at least one fail flip flop in the plurality of scan chains in response to the plurality of values outputted from the plurality of scan chains; and
    identifying at least one fault site corresponding to the at least one fail flip flop.

2. The method of claim 1, wherein generating the mapping table comprises:
    acquiring a plurality of first test patterns to determine the plurality of shift cycles and the plurality of scan chains.

3. The method of claim 1, further comprising:
    generating a plurality of first test patterns and a plurality of second test patterns according to a plurality of scan chain test patterns;
    loading the plurality of first test patterns into the plurality of scan chains to store the plurality of values associated with the plurality of first test patterns; and
    outputting the plurality of values to be included in the plurality of second test patterns for determining the at least one fail flip flop.

4. The method of claim 1, further comprising:
    operating, by a tester, the integrated circuit for a predetermined number of the plurality of shift cycles to generate a fail log, wherein the fail log is associated with the plurality of scan chains and the plurality of values; and
    mapping the fail log to the mapping table to determine the at least one fail flip flop.

5. The method of claim 1, wherein determining the at least one fail flip flop comprises:
    determining at least one fail chain and at least one fail shift cycle corresponding to at least one fail value in the plurality of values outputted from the plurality of scan chains; and
    mapping the at least one fail chain and the at least one fail shift cycle to the plurality of scan chains to identify the at least one fail flip flop.

6. The method of claim 1, wherein determining the at least one fail flip flop comprises:
    when the at least one fail flip flop comprises first and second fail flip flops in first and second chains, respectively, of the plurality of scan chains,
    identifying a first fail value in outputted values from the first chain and identifying a second fail value in outputted values from the second chain; and
    determining, based on the mapping table, the first and second fail flip flops;
    wherein the first chain abuts the second chain and at least one flip flop in the first chain is coupled to the second chain.

7. The method of claim 6, further comprising:
    acquiring from a database, by the processing unit, a plurality of sites, including the at least one fault site, corresponding to the plurality of scan chains.

8. A method, comprising:
    testing, by a tester, a first scan chain operating at a first voltage level with a first test pattern;
    after operating the first scan chain at a second voltage level lower than the first voltage level, re-testing the first scan chain operating at the first voltage level with a second test pattern to generate a fail log; and
    diagnosing, by a processing unit, at least one first fail flip flop in the first scan chain according to the fail log and a mapping table, wherein the mapping table is associated with the first scan chain and a plurality of shift cycles, wherein diagnosing the at least one first fail flip flop comprises:
- determine at least one fail cycle in the plurality of shift cycles; and
- determining the at least one first fail flip flop, corresponding to the at least one fail cycle, in the first scan chain.

9. The method of claim 8, wherein testing the first scan chain with the first test pattern comprises:
- loading a plurality of values into the first scan chain and storing the plurality of values in the first scan chain;
- wherein re-testing the first scan chain comprises:
  - clocking the plurality of stored values out as a plurality of outputted values in the plurality of shift cycles; and
  - generating at least one fail resultant value by comparing the plurality of outputted values with the plurality of values.

10. The method of claim 8, wherein the fail log is associated with a sequence of plurality of shift cycles and a plurality of outputted values corresponding to the plurality of shift cycles.

11. The method of claim 10, wherein diagnosing the at least one first fail flip flop further comprises:
- mapping the fail log to the mapping table; and
- detecting at least one fail resultant value in the mapping table for determining the at least one first fail flip flop.

12. The method of claim 8, wherein diagnosing the at least one first fail flip flop further comprises:
- mapping the fail log to the mapping table; and
- acquiring from a database, by the processing unit, at least one fault site corresponding to the at least one first fail flip flop for performing a physical fault analysis.

13. The method of claim 8, further comprising:
- testing a second scan chain operating at the first voltage level with a third test pattern;
- after operating the second scan chain at the second voltage level, re-testing the second scan chain operating at the first voltage level with a fourth test pattern to update the fail log; and
- diagnosing, at least one second fail flip flop in the second scan chain according to the fail log and the mapping table;
- wherein the first scan chain comprises at least one flip flop coupled between two adjacent flip flops in the second scan chain.

14. The method of claim 13, wherein the first test pattern is different from the third test pattern.

15. The method of claim 13, wherein diagnosing the at least one second fail flip flop in the second scan chain comprises:
- determining whether an input terminal of a latch circuit for storing values in the at least one second fail flip flop is short circuited.

16. A system, comprising:
- one or more processing units; and
- a storage unit configured to store instructions that when executed by at least one of the one or more processing units perform operations, comprising:
  - record a resultant pattern received from a tester, wherein the resultant pattern comprises a plurality of bit data;
  - detect at least one fail resultant value in the resultant pattern;
  - determine a fail chain and at least one fail shift cycle that correspond to the at least one fail resultant value; and
  - determine at least one fail flip flop associated with the fail chain and the at least one fail shift cycle.

17. The system of claim 16, wherein the operations further comprise:
- acquire at least one fault site corresponding to the at least one fail flip flop from a database.

18. The system of claim 16, wherein the operations further comprise:
- generate a test pattern based on a scan chain pattern to the tester to operate an integrated circuit swinging between a first voltage level and a second voltage level lower than the first voltage level; and
- generate a mapping table associated with the test pattern, wherein the mapping table is associated with a plurality of shift cycles.

19. The system of claim 16, wherein the operations further comprise:
- map the resultant pattern to a plurality of shift cycle and a plurality of chains to determine the fail chain and the at least one fail shift cycle.

20. The system of claim 16, wherein the operations further comprise:
- map the at least one fail shift cycle to a plurality of flip flops in the fail chain to determine the at least one fail flip flop.

* * * * *